US008899148B2

(12) United States Patent
Rudolph (10) Patent No.: US 8,899,148 B2
(45) Date of Patent: *Dec. 2, 2014

(54) METHOD FOR PRINTING A MATERIAL ONTO A SUBSTRATE (75) Inventor: Michael Lee Rudolph, Newark, DE (US)

(73) Assignee: E I du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 13/320,831

(22) PCT Filed: Jul. 1, 2010

(86) PCT No.: PCT/US2010/040723
§ 371 (c)(1),
(2), (4) Date: Nov. 16, 2011

(87) PCT Pub. No.: WO2011/002967
PCT Pub. Date: Jan. 6, 2011

(65) Prior Publication Data
US 2012/0060711 A1    Mar. 15, 2012

Related U.S. Application Data (60) Provisional application No. 61/222,669, filed on Jul. 2, 2009.

(51) Int. Cl.
*B41M 1/04* (2006.01)
*B41M 3/00* (2006.01)
*G03F 7/20* (2006.01)
*G02F 1/1337* (2006.01)

(52) U.S. Cl.
CPC ........ *G03F 7/2012* (2013.01); *G02F 1/133711* (2013.01); *G03F 7/2018* (2013.01); *G03F 7/202* (2013.01); *G03F 7/2022* (2013.01)

USPC ......... 101/216; 101/401.1; 101/483; 403/306

(58) Field of Classification Search
None
See application file for complete search history.

(56) References Cited

U.S. PATENT DOCUMENTS 2,927,024 A    3/1960    Woodward et al.
3,060,023 A    10/1962    Burg et al.
(Continued)

FOREIGN PATENT DOCUMENTS

EP    0 017 927 B1    10/1980
EP    0 741 330 A1    11/1996
(Continued)

OTHER PUBLICATIONS

U.S. Appl. No. 12/346,608, filed Jan. 7, 1999, Rudolph.
(Continued)

*Primary Examiner* — Joshua D Zimmerman (57) ABSTRACT

The invention provides a method for printing a material onto a substrate with a relief printing form made from a photosensitive element. The method includes forming an in-situ mask having a line screen resolution equal to or greater than 250 lines per inch on the photosensitive element, exposing the element to actinic radiation through the in-situ mask in an environment having an inert gas and a concentration of oxygen between 190,000 and 100 ppm, and treating the exposed element to form a relief structure having a plurality of raised surfaces with a line screen resolution equal to or greater than 250 lines per inch. Printing is accomplished by applying an imaging material to the plurality of raised surfaces and contacting to transfer the imaging material to the substrate. The method is suitable for printing high resolution graphic images, as well as for forming a uniform layer of imaging material on the substrate.

20 Claims, 2 Drawing Sheets

(56) References Cited

U.S. PATENT DOCUMENTS

| | | | |
|---|---|---|---|
| 3,144,331 | A | 8/1964 | Thommes |
| 3,264,103 | A | 8/1966 | Cohen at al. |
| 3,796,602 | A | 3/1974 | Briney at al. |
| 4,045,231 | A | 8/1977 | Toda et al. |
| 4,177,074 | A | 12/1979 | Proskow |
| 4,323,636 | A | 4/1982 | Chen |
| 4,323,637 | A | 4/1982 | Chen et al. |
| 4,427,759 | A | 1/1984 | Gruetzmacher et al. |
| 4,430,417 | A | 2/1984 | Heinz et al. |
| 4,431,723 | A | 2/1984 | Proskow |
| 4,460,675 | A | 7/1984 | Gruetzmacher et al. |
| 4,517,279 | A | 5/1985 | Worns |
| 4,540,649 | A | 9/1985 | Sakurai |
| 4,726,877 | A | 2/1988 | Fryd et al. |
| 4,753,865 | A | 6/1988 | Fryd et al. |
| 4,806,506 | A | 2/1989 | Gibson, Jr. |
| 4,894,315 | A | 1/1990 | Feinberg et al. |
| 4,942,111 | A | 7/1990 | Wade et al. |
| 4,956,252 | A | 9/1990 | Fryd et al. |
| 5,015,556 | A | 5/1991 | Martens |
| 5,175,072 | A | 12/1992 | Martens |
| 5,215,859 | A | 6/1993 | Martens |
| 5,262,275 | A | 11/1993 | Fan |
| 5,279,697 | A | 1/1994 | Peterson et al. |
| 5,301,610 | A | 4/1994 | McConnell |
| 5,330,882 | A | 7/1994 | Kawaguchi et al. |
| 5,385,611 | A | 1/1995 | Matsumoto et al. |
| 5,486,384 | A | 1/1996 | Bastian et al. |
| 5,506,086 | A | 4/1996 | Van Zoeren |
| 5,516,626 | A | 5/1996 | Ohmi et al. |
| 5,607,814 | A | 3/1997 | Fan et al. |
| 5,645,974 | A | 7/1997 | Ohta et al. |
| 5,654,125 | A | 8/1997 | Fan et al. |
| 5,679,485 | A | 10/1997 | Suzuki et al. |
| 5,688,633 | A | 11/1997 | Leach |
| 5,705,310 | A | 1/1998 | Van Zoeren |
| 5,707,773 | A | 1/1998 | Grossman et al. |
| 5,719,009 | A | 2/1998 | Fan |
| 5,760,880 | A | 6/1998 | Fan et al. |
| 5,766,819 | A | 6/1998 | Blanchet-Fincher |
| 5,771,809 | A | 6/1998 | Hecht |
| 5,798,019 | A | 8/1998 | Cushner et al. |
| 5,830,621 | A | 11/1998 | Suzuki et al. |
| 5,840,463 | A | 11/1998 | Blanchet-Fincher |
| 5,863,704 | A | 1/1999 | Sakurai et al. |
| 5,888,701 | A | 3/1999 | Fan |
| 6,037,102 | A | 3/2000 | Loerzer et al. |
| 6,185,840 | B1 | 2/2001 | Noelle et al. |
| 6,217,965 | B1 | 4/2001 | Gelbart |
| 6,238,837 | B1 | 5/2001 | Fan |
| 6,284,431 | B1 | 9/2001 | Tanizaki et al. |
| 6,558,876 | B1 | 5/2003 | Fan |
| 6,673,509 | B1 | 1/2004 | Metzger |
| 6,766,740 | B1 | 7/2004 | Wier |
| 6,773,859 | B2 | 8/2004 | Fan et al. |
| 6,797,454 | B1 | 9/2004 | Johnson et al. |
| 6,929,898 | B2 | 8/2005 | Fan |
| 7,105,206 | B1 | 9/2006 | Beck et al. |
| 7,348,123 | B2 | 3/2008 | Mengel et al. |
| 7,399,575 | B2 | 7/2008 | Takagi et al. |
| 2002/0115019 | A1 | 8/2002 | Kaczun et al. |
| 2003/0211419 | A1 | 11/2003 | Fan |
| 2004/0048199 | A1 | 3/2004 | Schadebrodt et al. |
| 2004/0234886 | A1 | 11/2004 | Rudolph et al. |
| 2004/0259033 | A1 | 12/2004 | Kunita |
| 2005/0142480 | A1 | 6/2005 | Bode et al. |
| 2005/0231708 | A1 | 10/2005 | Sunagawa et al. |
| 2005/0266358 | A1 | 12/2005 | Roberts et al. |
| 2006/0016355 | A1 | 1/2006 | Saai et al. |
| 2006/0055761 | A1 | 3/2006 | Daems et al. |
| 2006/0105268 | A1 | 5/2006 | Vest |
| 2006/0144272 | A1 | 7/2006 | Haraguchi et al. |
| 2008/0063979 | A1 | 3/2008 | Tomita et al. |
| 2009/0245613 | A1 * | 10/2009 | Wu et al. ................ 382/137 |
| 2010/0218694 | A1 | 9/2010 | Wier et al. |

FOREIGN PATENT DOCUMENTS

| | | |
|---|---|---|
| EP | 0891 877 A2 | 1/1999 |
| EP | 0 945 753 A1 | 9/1999 |
| EP | 1 160 627 A2 | 12/2001 |
| JP | 53-008655 | 1/1978 |
| JP | 58-063939 | 4/1983 |
| JP | 03-239263 | 10/1991 |
| JP | 06-214377 | 8/1994 |
| JP | 2005-283778 A | 10/2005 |
| JP | 2005-316325 | 11/2005 |
| JP | 2009034913 A * | 2/2009 |
| JP | 2009-058902 | 3/2009 |
| NL | 8 900 784 A | 10/1990 |
| WO | WO 92/21518 | 12/1992 |
| WO | WO 2005/026836 A2 | 3/2005 |
| WO | WO 2008/034810 A2 | 3/2008 |
| WO | WO 2009/016974 A1 | 2/2009 |
| WO | WO 2009/020496 A1 | 2/2009 |
| WO | WO 2009/033124 A2 | 3/2009 |

OTHER PUBLICATIONS

U.S. Appl. No. 12/356,752, filed Jan. 21, 2009, Rudolph et al.
U.S. Appl. No. 12/401,106, filed Mar. 1, 2009, Rudolph et al.
B. Taylor, R. Fan, G. Blanchet, "The Digital Difference", FLEXO™ Magazine, Jul. 1997.
Flexography: Principles and Practice, Ronkonkoma, New York—4th Edition and 5th Edition, 1999, Chapters 8-12, pp. 103-379, (Chapter 8, pp. 103-147; Chapter 9, pp. 149-177; Chapter 10, pp. 181-288; Chapter 11, pp. 289-318; Chapter 12, pp. 319-376.
Charles R. Morgan and David R. Kyle, UV Generated Oxygen Scavengers and Method for Determining Their Effectiveness in Photopolymerizable Systems, Journal of Radiation Curing, Oct. 1983, pp. 4-7.
Dr. A.R. Kannurpatti and Dr. B.K. Taylor, Taming Photopolymerization, The Platemaker's Role in Controlling the Process, Product Trend Report, Flexographic Technical Association, FLEXO, Nov. 2001.
Takashi Odajima, Honggi Bae, Tadashi Kawamoto, Yuichi Nakajima, and Yoshikazu Matsumoto, Abstract of WO 2009/016974 A1, Nakan Corporation, Feb. 5, 2009.
U.S. Appl. No. 13/527,771, filed Jun. 20, 2012, Rudolph.
U.S. Appl. No. 13/493,004, filed Jun. 11, 2012, Rudolph et al.
U.S. Appl. No. 13/527,936, filed Jun. 20, 2012, Rudolph et al.
U.S. Appl. No. 12/401,106, filed Mar. 3, 2009, Rudolph et al.
U.S. Appl. No. 13/593,092, filed Aug. 23, 2012, Schieffer, Jr. et al.
U.S. Appl. No. 13/771,310, filed Feb. 20, 2012, Schieffer, Jr. et al.
U.S. Appl. No. 12/349,608, filed Jan. 7, 1999, Rudolph.

* cited by examiner

METHOD FOR PRINTING A MATERIAL ONTO A SUBSTRATE

BACKGROUND OF THE INVENTION

1. Field of the Disclosure

This invention pertains to a method for printing a material onto a substrate, and in particular, to a method of printing using a relief printing form that transfers the material from a plurality of raised surfaces upon contact to the substrate.

2. Description of Related Art

Flexographic printing plates are widely used for printing of packaging materials ranging from corrugated carton boxes to cardboard boxes and to continuous web of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. Photosensitive elements generally have a solid layer of the photopolymerizable composition interposed between a support and a coversheet or a multilayer cover element. Flexographic printing plates are characterized by their ability to crosslink or cure upon exposure to actinic radiation. The plate is imagewise exposed with actinic radiation through an image-bearing art-work or a template, such as a photographic negative or transparency (e.g., silver halide films) for so called analog workflow, or through an in-situ mask having radiation opaque areas that had been previously formed above the photopolymerizable layer for so called digital workflow. The actinic radiation exposure is typically conducted with ultraviolet (UV) radiation. The actinic radiation enters the photosensitive element through the clear areas and is blocked from entering the black or opaque areas of the transparency or in-situ mask. The areas of the photopolymerizable layer that were exposed to the actinic radiation crosslink and harden and/or become insoluble to solvents used during development. The unexposed areas of the photopolymerizable layer that were under the opaque regions of the transparency or the in-situ mask during exposure do not hardened and/or remain soluble. The unexposed areas are removed by treating with a washout solution or heat leaving a relief image suitable for printing. If treated with washout solution, the plate is dried. After all desired processing steps, the plate is then mounted on a cylinder and used for printing.

A flexographic-like printing process is used today to coat polyimide materials onto surfaces in the construction of a liquid crystal display device (LCD). The polyimide material is used as an orientation layer in a liquid display device. A flexographic relief printing form is fundamentally used as a coating plate with typically a 400 line per inch (LPI) and a 40% image in an area/s of the plate that transfers the polyimide material to form a coating on the substrate. A coating plate is a printing form, such as a plate or cylinder, having a relief pattern that is intentionally designed to provide a uniform coating (i.e. layer) of a material on selected regions of the substrate. The relief printing form includes a relief structure having one or more areas, i.e., coating areas, composed of a plurality of fine, closely-spaced, raised surface elements that transfer the coating material to the substrate; and having one or more recessed areas that do not pickup the coating material and that form non-coated areas on the substrate. Upon transfer, the plurality of fine, closely-spaced raised surface elements create a uniform layer of the coating material on the substrate, i.e., a continuous layer of the coating material on the contacted region of the substrate. The relief printing form transfers the coating material from the one or more coating areas to the substrate to form a pattern of coated regions and non-coated regions, where the coated regions each have the uniform layer of the coating material on the substrate. The relief printing form with the plurality of fine, closely-spaced raised surface elements is necessary to meet the predefined specifications and to create the pattern of uniform layer of the coating material in the selected regions on the substrate. Although it is possible to create a relief printing form having one or more coating areas composed of a singular, raised surface element instead of the plurality of fine closely-spaced raised surface elements, transfer of the coating material by the singular raised surface element does not create a sufficiently uniform layer of the coating material in the coated regions on the substrate.

Currently relief printing plates or printing forms for coating polyimide materials are fabricated by either of two methods from photosensitive precursors. One method to fabricate the relief printing form utilizes a sheet plate material, such as, for example, CYREL® NOW (from DuPont, Wilmington, Del.) photopolymerizable printing precursor, and a second method utilizes liquid plate manufacturing workflow, such as, for example, Asahi APR K-11. The sheet plate fabrication involves conventional solid plate-making steps with analog workflow used to imagewise expose the plate through the silver halide photographic negative as described above. The liquid plate fabrication involves conventional multi-step liquid plate-making process that includes making an intermediate by etching a chrome coating of an image on a glass substrate.

In other printing applications, after printed matter is formed either before or after the ink has dried, it is conventional to apply a coating over selected areas of the printed substrate. This process is generally termed spot or pattern coating. Spot coating constitutes applying a coating in small areas surrounded by a lack of coating in large surrounding areas. Alternatively, a coating termed "pattern coating" may be applied in large areas with the absence of coating in small selected areas. The coating may be applied for various reasons including to protect the printed material; to prevent the printed material from sticking to other sheets when placed in a pile of sheets, when the ink is still wet or tacky; and, to improve scuff resistance. The coating may also be applied to selected areas for aesthetic reasons. For example, it is sometimes desired to provide gloss to certain areas of the sheet in order to provide highlighting while leaving other areas dull. Additionally, when certain areas of printing folding cartons must be coated with an adhesive, pattern coating is used to avoid the adhesive coated areas. Hereto, the relief printing form should include a relief structure having one or more coating areas that is composed of a plurality of fine, closely-spaced, raised surface elements to transfer the coating material and form a suitable coating layer on the substrate.

Both the solid and liquid plate workflows involve making an intermediate, i.e., the photographic negative and the chrome patterned glass. Analog workflow requires the preparation of the phototool, which is a complicated, costly and time-consuming process requiring separate processing equipment and chemical development solutions. In addition, the phototool may change slightly in dimension due to changes in temperature and humidity. The same phototool, when used at different times or in different environments, may give different results. Use of a phototool also requires special care and handling when fabricating flexographic printing forms to ensure intimate contact is maintained between the phototool and plate. In particular, care is required in the placement of both the phototool and the plate in the exposure apparatus along with special materials to minimize air entrapment during creation of a vacuum to ensure intimate contact. Additionally care must be taken to ensure all surfaces of the photopolymer plate and phototool are clean and free of dust and dirt. Presence of such foreign matter can cause lack of intimate contact between the phototool and plate as well as image artifacts.

An alternative to analog workflow is termed digital workflow, which does not require the preparation of a separate phototool. Photosensitive elements suitable for use as the precursor and processes capable of forming an in-situ mask in digital workflow are described in U.S. Pat. No. 5,262,275; U.S. Pat. No. 5,719,009; U.S. Pat. No. 5,607,814; U.S. Pat. No. 6,238,837; U.S. Pat. No. 6,558,876; U.S. Pat. No. 6,929,898; U.S. Pat. No. 6,673,509; U.S. Pat. No. 5,607,814; U.S. Pat. No. 6,037,102; and U.S. Pat. No. 6,284,431. The precursor or an assemblage with the precursor includes a layer sensitive to infrared radiation and opaque to actinic radiation. The infrared-sensitive layer is imagewise exposed with laser radiation whereby the infrared-sensitive material is removed from, or transferred onto/from a superposed film of the assemblage, to form the in-situ mask having radiation opaque areas and clear areas adjacent the photopolymerizable layer. The precursor is exposed through the in-situ mask to actinic radiation in the presence of atmospheric oxygen (since no vacuum is needed). Furthermore, due in part to the presence of atmospheric oxygen during imagewise exposure the flexographic printing form has a relief structure that is different from the relief structure formed in analog workflow (based upon the same size mask openings in both workflows). Digital workflow creates a raised element (i.e., dot) in the relief structure having a surface area of its uppermost surface (i.e., printing surface) that is significantly less than the opening in the in-situ mask corresponding to the relief structure. Digital workflow results in the relief image having a different structure for dots (i.e., raised surface elements) that is typically smaller, with a rounded top, and a curved sidewall profile, often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form. But not all end-use applications view this dot-sharpening effect as beneficial.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Many prior disclosures acknowledge that it is desirable for photopolymerization exposure to actinic radiation to occur in air (as is the case for digital workflow), under vacuum (as is the case for analog workflow), or in an inert environment. Oftentimes, nitrogen is mentioned as a suitable inert gas for the inert environment. The implication is that the nitrogen environment is one that contains substantially less than atmospheric oxygen to the extent that all oxygen is removed, or something less than about 10 ppm of oxygen. Nitrogen with oxygen impurity concentration level less than 10 ppm is readily commercially available.

There is a desire to eliminate the costs and the time consuming and problematic process steps associated with the preparation of the photographic negative intermediate, and transition from analog workflow to digital workflow in the fabrication of solid plates that are capable of transferring a coating material to form a layer of the coating material on a substrate. However, the dot-sharpening effect associated with conventional digital exposure in the presence of atmospheric oxygen becomes a disadvantage for relief printing forms, such as the coatings plate, that need to have a relief structure that is generated by high line resolution imaging. Because imagewise exposure in digital workflow is conducted in the presence of atmospheric oxygen which inhibits polymerization, the dot structure of the raised surface element has a printable surface area that is considerably reduced (compared to that produced by analog workflow, as well as compared to the corresponding opening in the digital mask image). The magnitude of the reduction in printable dot surface area made by the conventional digital workflow is such that the plurality of raised printing elements in the coating area of the printing form are not sufficiently close enough that a uniform layer of the coating material can be formed on the substrate. The number of raised surface elements and the proximity of the raised elements to each other in a given coating area of the relief printing form must be maintained at the high line screen resolution, i.e., greater than 250 lines per inch, in order for the printing form to provide the desired uniformity of the layer of coating material on the substrate. As was explained above, it is necessary for the printing form to have coating areas with a high resolution relief pattern, i.e., plurality of fine, closely-space raised surface elements, in order to transfer and form a uniform layer of the coating material on the substrate. Further, the magnitude of the reduction in printable dot surface area made by the digital workflow cannot be compensated by creating larger openings in the in-situ mask because each opening would need to be larger than the dimension of a pixel associated with the desired line/dot resolution, and would overlap into the adjacent pixel. Consequently, it is not possible by conventional digital workflow to fabricate a relief printing form that has a plurality of fine and closely-spaced, raised surface elements (i.e., dots) in a coating area sufficient to transfer a coating material and form a uniform continuous layer of the coating material on the substrate.

In other end-use applications, it is desirable to create a relief surface for a flexographic printing form that is suitable for printing and accurately reproduces a pattern of high-line screen resolution images and/or text on desired document or other item. Security printing is one such end-use application which is placing increasing demands for reproduction of high-resolution images. Security printing deals with the printing of items, such as banknotes, passports, tamper-evident labels, stock certificates, postage stamps, and identity cards, in order to prevent forgery, tampering, or counterfeiting of the document or object. One example of high-resolution images used in security printing is microprinting. Microprinting involves the use of extremely small text, and is most often used on currency and bank checks. The text is generally small enough to be indiscernible to the naked eye. In such high-line screen resolution printing applications, the raised surface elements in a given coating area of the relief printing form should be formed at high line screen resolutions, i.e., equal to or greater than 250 lines per inch, so that each of the raised surface elements are sufficiently fine and well-structured to be capable of accurately reproducing the desired fine image pattern on the substrate, document, or other item. Hereto, it is desirable to fabricate the printing form using digital workflow due to its ease and simplicity, while providing a relief structure in the printing form similar to or the same as the relief structure created by analog workflow.

Thus, the need to use digital workflow in the fabrication of relief printing forms conflicts with the need for the printing form to have high line resolution raised surface elements similar to the size and proximity of the raised surface elements produced by analog workflow. So a need arises for a method of fabricating a relief printing form from a photosensitive precursor element that utilizes digital workflow to eliminate the costly and problematic creation of a separate intermediate. The relief printing form needs to have a relief structure composed of recessed areas and raised areas for forming a pattern of printing regions on a substrate, wherein each the raised area is composed of a plurality of fine, closely-spaced, raised surface elements capable of transferring an imaging material, such as an ink, varnish, orientation material, or other coating material, to create the desired image in the printing regions on the substrate.

SUMMARY OF THE INVENTION

A method for printing a material onto a substrate includes providing a relief printing form from a photosensitive element having a photopolymerizable layer with steps, including but not limited to i) forming an in-situ mask having a plurality of openings through an area opaque to actinic radiation adjacent the photopolymerizable layer, the openings having a line screen resolution equal to or greater than 250 lines per inch; ii) exposing the photopolymerizable layer to actinic radiation through the mask openings in an environment having an inert gas and a concentration of oxygen between 190,000 parts per million (ppm) and 100 ppm; and iii) treating the element resulting from step ii) to form a relief structure having a plurality of raised surfaces with a line-screen resolution equal to or greater than 250 lines per inch. The method for printing includes applying the material to the plurality of raised surfaces; and contacting the material from the plurality of raised surfaces to the substrate thereby transferring the material to the substrate.

Another embodiment provides a method for preparing a relief printing form including an elastomeric layer having a relief structure comprising a plurality of raised surfaces with a line-screen resolution equal to or greater than 250 lines per inch. The method includes, but is not limited to, providing a photosensitive element comprising an elastomeric layer of a photopolymerizable composition containing a binder, an ethylenically unsaturated compound, and a photoinitiator; forming an in-situ mask having a plurality of openings through an area opaque to actinic radiation adjacent the photopolymerizable layer, the openings having a line screen resolution equal to or greater than 250 lines per inch; exposing the photopolymerizable layer to actinic radiation through the mask openings in an environment having an inert gas and a concentration of oxygen between 190,000 parts per million (ppm) and 100 ppm; and, treating the resulting element to form a relief structure having a plurality of raised surfaces with a line-screen resolution equal to or greater than 250 lines per inch.

DESCRIPTION OF THE PREFERRED EMBODIMENTS

Throughout the following detailed description, similar reference characters refer to similar elements in all figures of the drawings.

The present invention is a method for printing a material onto a substrate, and in particular, to a method of printing using a relief printing form that transfers the material, i.e., imaging material, from a plurality of raised surfaces upon contact to the substrate. The relief printing form has a relief structure composed of recessed areas and raised areas for forming a pattern of one or more regions of the imaging material on a substrate, wherein each raised area is composed of a plurality of fine, well-structured, raised surface elements that are capable of creating a desired image of the imaging material at the printing or coating regions on the substrate. In some embodiments, the pattern formed on the substrate includes one or more coating regions of the imaging material, which may be referred to as a coating material, and one or more non-coating regions. In this embodiment of the inventive method, the desired image transferred by the relief printing form is a layer of the coating material at the selected, i.e., coating regions, on the substrate. In other embodiments, the pattern formed on the substrate includes one or more printing regions of the imaging material, which may be referred to as a printing material, and one or more non-printing regions. In this embodiment of the inventive method, the desired image transferred by the relief printing form at the one or more printing regions is an image/s of graphic information that includes halftone illustration, text, and/or line features, reproduced from the plurality of raised surface elements of the relief structure.

The present method for printing the imaging material on a substrate uses a relief printing form made from a photosensitive precursor element having an in-situ mask. The photosensitive precursor element is a photopolymerizable printing element having a layer of a photopolymerizable composition that includes a binder, an ethylenically unsaturated compound, and a photoinitiator. The relief printing form includes a pattern of raised areas composed of a plurality of raised surface elements that is formed by imagewise exposure of the photosensitive element through the in-situ mask to actinic radiation in an environment having an inert gas and a concentration of oxygen less than atmospheric oxygen. In most embodiments, the concentration of oxygen during imagewise exposure through the in-situ mask is between 190,000 parts per million (ppm) and 100 ppm. Imagewise exposure of the photosensitive element through the in-situ mask composed of openings having a line screen resolution of equal to or greater than 250 lines per inch, and in the environment having the inert gas and the particular oxygen content, provides the printing form with a plurality of fine, well-structured raised surface elements each with top surface area for transferring the imaging material that is suitable to create the desired image in the printing or coating regions on the substrate.

It has surprisingly and unexpectedly been found that a relief printing form having a plurality of fine, well-structured, raised surface elements can be achieved with a digital workflow-like process (i.e., modified digital workflow) in which the photosensitive element is imagewise exposed in an environment having an inert gas and a concentration of oxygen less than atmospheric but greater than a completely inert gas environment. The raised surface elements are sufficiently fine and well-structured that a high resolution image of equal to greater than 250 lines per inch can be reproduced on the substrate by transferring, i.e., printing, the imaging material individually from each of the raised surface elements of the plurality of raised surface elements to the substrate. The present method provides for the printing of a high resolution image composed of graphic information of the imaging material on the substrate. The present method provides the printing form with the raised printing areas composed of the fine, well-structured raised surface elements, in which each raised surface element is well-structured by its conical shape and has a flat or substantially flat top surface area sufficient to accurately reproduce the desired high resolution image on the substrate. In addition, it is surprising and unexpected that the digital workflow-like process can form the fine raised surface elements at sufficient proximity to one another that the plurality of raised surface elements can print, i.e., coat, a uniform layer of coating material can on the substrate. The present invention also provides a relief printing form with the capability for improved uniformity of the layer of the imaging material on the substrate over relief printing forms made by conventional methods of digital workflow, and even analog workflow. No longer is the relief structure in a relief printing form fabricated by digital workflow limited by oxygen inhibition effect on the photopolymerizable layer. The present invention provides for the capability to create the relief of the raised areas on the printing form that essentially is the recreation of the in-situ mask image, particularly in terms of size of openings in mask relative to the size of the raise surface element (e.g., halftone dot). The present invention also avoids the cost and production disadvantages associated with analog workflow, and capitalizes on the efficiencies of digital workflow while avoiding the difficulty of establishing a completely inert environment.

A method for providing a relief printing form from a photosensitive element includes forming an in-situ mask adjacent the photopolymerizable layer, exposing the photopolymerizable layer of the photosensitive element to actinic radiation through the in-situ mask in an environment having an inert gas and a concentration of oxygen between 190,000 and 100 parts per million (ppm), and treating the exposed element to form the relief printing form having a pattern of raised areas for printing and recessed areas. The photosensitive element includes a layer of a photopolymerizable composition composed of at least a binder, an ethylenically unsaturated compound, and a photoinitiator. In most embodiments the photopolymerizable layer is on or adjacent a support. The photosensitive element for use in the present invention is not limited, provided that the photosensitive element is capable of having an in-situ mask on or adjacent the photopolymerizable layer. The in-situ mask is an image of opaque areas and transparent areas that is integral or substantially integral with the photosensitive element for imagewise exposure to actinic radiation, and does not need vacuum to assure contact of the mask to the photopolymerizable layer. The in-situ mask avoids the drawbacks associated with generating a separate phototool and using vacuum to assure contact of the phototool to the photosensitive layer when making the relief printing form.

The method includes forming an in-situ mask having a plurality of openings through an area opaque to actinic radiation adjacent the photopolymerizable layer, the openings having a line-screen resolution equal to or greater than 250 lines per inch. The in-situ mask image is adjacent the photopolymerizable layer when the mask is formed on or disposed above the surface of the photopolymerizable layer opposite the support. The mask is an image that includes opaque areas, and openings of transparent or "clear" areas. The opaque areas of the mask prevent the photopolymerizable material beneath from being exposed to the radiation (i.e., actinic radiation opaque areas) and hence those areas of the photopolymerizable layer covered by the dark areas do not polymerize. The "clear" areas of the mask expose the photopolymerizable layer to actinic radiation and polymerize or crosslink the underlying portions of the photopolymerizable layer. The clear areas of the mask form the plurality of openings through an area opaque to actinic radiation. The mask image of the photosensitive element ultimately creates the relief structure of the pattern of raised areas, i.e., printing areas, for the relief printing form.

The method by which the in-situ mask is formed with an actinic radiation opaque material is not limited. The in-situ mask can be generated by any suitable method, including digital direct-to-plate methods using laser radiation (often referred to as digital methods or digital workflow), and inkjet application, that is conducted prior to imagewise exposure of the photosensitive element to actinic radiation. The actinic radiation opaque layer is employed in digital direct-to-plate image technology in which laser radiation, typically infrared laser radiation, is used to form a mask of the image for the photosensitive element (instead of the conventional image transparency or phototool). Generally, digital methods of in-situ mask formation use laser radiation to either selectively remove or transfer a radiation opaque material, from or to a surface of the photosensitive element opposite the support. Digital methods of creating the mask image require one or more steps to prepare the photosensitive element prior to imagewise exposure.

In one embodiment, the photosensitive element initially includes an actinic radiation opaque layer disposed on or above a surface of the photopolymerizable layer opposite the support, and laser radiation imagewise removes, i.e., ablates or vaporizes, the radiation opaque layer to form the in-situ mask. Only the portions of the radiation opaque layer that were not removed from the photosensitive element will remain on the element to create the mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support. The assemblage is exposed imagewise with laser radiation to selectively transfer or selectively alter the adhesion balance of the radiation opaque layer and form the mask image on or disposed above the photopolymerizable layer. In this embodiment, only the transferred portions of the radiation opaque layer reside on the photosensitive element forming the in-situ mask.

It is contemplated that digital mask formation could also be accomplished by imagewise application of the radiation opaque material in the form of inkjet inks on the photosensitive element, provided that ink jet application devices have the capability of applying ink equal to or greater than 250 lpi. Imagewise application of ink-jet ink can be directly on the photopolymerizable layer or disposed above the photopolymerizable layer on another layer of the photosensitive element.

Another contemplated embodiment for forming the in-situ mask is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier can then be removed from the element prior to imagewise exposure.

In some embodiments, the laser radiation used to form the mask is infrared laser radiation. The infrared laser exposure can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in situ mask image remains on the photosensitive element for the subsequent step of overall exposure to actinic radiation.

The plurality of openings in the in-situ mask has a line screen resolution of equal to or greater than 250 lines per inch so that the individual raised surface elements can be sufficiently finely formed so that in some instances high-resolution or fine-detail graphic images can be printed, and in other instances a sufficient number of the raised surface elements can be closely-spaced to one another to create a uniform coating layer of the imaging material on the substrate. If the plurality of openings in the in-situ mask has a line screen resolution less than 250 lines per inch, individual raised surface elements will still be formed, but will not be of sufficient finely formed to print a suitable high resolution graphic image. In particular for one embodiment, at line screen resolutions less than 250 lines per inch, the individual raised surface elements will not be of sufficient number and close proximity to one another to create a uniform layer of coating material on the substrate. The line screen resolution of the plurality of openings of the in-situ mask equal to or greater than 250 lines per inch (lpi) is not particularly limited. Mask line screen resolutions that can be used in the present method include conventional line screen resolutions of 300 lpi, 350 lpi, 400 lpi, and 600 lpi, but is not limited thereto since mask line screen resolutions intermediate to the conventional line screen resolutions are possible and could be used.

In some embodiments of printing a coating material to form a layer of the material on the substrate, the openings created in the mask have a dot area that is in the range of 20 to 80%. In some other embodiments, the openings created in the mask have a dot area that is in the range of 30 to 60%. For coating a uniform layer, in most instances, the dot area in the mask openings for each of the raised surface elements is the same or substantially for any given raised area that will print the coating material. The selection of the particular dot area of the mask openings used will depend upon at least on the properties of the particular material being coated, the desired coating thickness, and the substrate. In embodiments where the present method is used to print high resolution graphic images, which can include text features, line features, and halftone illustrations, the openings created in the mask have a dot area that can range from 2 to 99%. The dot area for each of the raised surface elements of the raised printing areas will vary according to the requirements of the graphic image being printed.

The next step of the method to prepare a relief printing form is to overall expose the photosensitive element to actinic radiation through the in-situ mask, that is, imagewise exposure of the element. Imagewise exposure of the photosensitive element to actinic radiation is conducted in an environment that includes the presence of an inert gas and an oxygen concentration of between 190,000 to 100 part per million (ppm). The inert gas is a gas that exhibits no or a low reaction rate with the photosensitive element (that is, inert to the polymerization reaction), and is capable of displacing oxygen in the exposure environment. Suitable inert gases include, but are not limited to, argon, helium, neon, krypton, xenon, nitrogen, carbon dioxide, and combinations thereof. In one embodiment, the inert gas is nitrogen.

Imagewise exposure of the photosensitive element in the particular environment of inert gas and oxygen concentration between 190,000 and 100 ppm creates in the printing form (after treatment) a relief structure of a plurality of raised surface elements each having a ink carrying top surface area that is structurally similar to an ink carrying top surface area created in a printing form that can be prepared with analog workflow. That is, the top surface area of the raised surface elements in the relief printing form prepared according to the present method is flat or substantially flat, and not rounded as is typical of conventional digital workflow wherein the element is exposed in the presence of atmospheric oxygen. Further, imagewise exposure of the photosensitive element through the in-situ mask in the presence of an inert gas and oxygen concentration between 190,000 and 100 ppm provides for the capability to create a printing area with the plurality of the individual raised surface elements sufficiently close together so that the printing area of the relief printing form can print or form a uniform coating of material to the substrate. Imagewise exposure of the photosensitive element through the in-situ mask in the presence of an inert gas and oxygen concentration between 190,000 and 100 ppm enables the use of digital workflow for mask creation yet counters the dot-sharpening effect caused by oxygen inhibition. Conventional digital workflow methods imagewise expose the photosensitive element to actinic radiation in air, which is 78% nitrogen, ~21% oxygen, <1% each argon and carbon dioxide, and trace amounts of other gases. In one embodiment, the photosensitive element does not include any additional layers on top of the in-situ mask, which additional layers may act as a barrier to the environment to the surface being imagewise exposed.

In one embodiment, the photosensitive element can be placed in an enclosure or chamber that is transparent to actinic radiation and adapted for placement on a bed of an exposure unit. One such embodiment of the enclosure is described in U.S. patent application Ser. No. 12/356,752, filed Jan. 21, 2009. In one embodiment, the enclosure can be sealed from external environment (room conditions) and includes an inlet port for introducing the inert gas into the enclosure and an outlet port for purging the air that is initially in the enclosure. A meter for measuring the concentration of oxygen within the enclosure may be located at the exit port.

In some embodiments after the oxygen concentration has reached 190,000 ppm or less in the enclosure, imagewise exposure is initiated and the oxygen concentration in the enclosure is continually reduced during imagewise exposure by continuous introduction of the inert gas into the enclosure. Imagewise exposure can begin when the concentration of oxygen is at or below 190,000 ppm (19%), and continue as the oxygen concentration reduces to less than or equal to 5000 ppm. In other embodiments, imagewise exposure can begin when the oxygen concentration is 1000 ppm and continue until the oxygen concentration reaches about 100 ppm. In some embodiments, the environment for the photosensitive element during exposure has a concentration of oxygen that is an average of the oxygen concentration at the start of the imagewise exposure and the oxygen concentration at the end of the imagewise exposure. In other embodiments, the environment for the photosensitive element during imagewise exposure has a concentration of oxygen that is a weighted average of the oxygen concentration based on the percentage of time of the total exposure time. In some embodiments, the environment has an average oxygen concentration of less than or equal to 80,000 ppm. In other embodiments, the environment has an average oxygen concentration of less than or equal to 30,000 ppm. In some embodiments after the oxygen concentration has reached 190,000 ppm or less in the enclosure, imagewise exposure is initiated and the oxygen concentration in the environment in the enclosure is maintained or substantially maintained by continuously purging with a combination of the inert gas and oxygen at the desired concentration.

The photosensitive element of the present invention is exposed through the in-situ mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° C. to about 35° C. Exposure is of sufficient duration to crosslink the exposed areas down to the support or to the back exposed layer, i.e., floor. Imagewise exposure time is typically much longer than backflash exposure time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, content fluorescent lamps, electron flash units, electron beam units, lasers, and photographic flood lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. In some embodiments, a mercury vapor arc or a sunlamp can be used. In other embodiments, a high-ultraviolet content fluorescent lamp can be used at a distance of about 1 to about 10 inches (about 2.54 to about 25.4 cm) from the photosensitive element. These radiation sources generally emit long-wave UV radiation between 310-400 nm.

In some embodiments, the method to make the relief printing form includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support and establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes. In some embodiments, a floor for may be included in the photosensitive element when the photosensitive element is produced, such that a separate backflash exposure may not be necessary.

Following overall exposure to UV radiation through the mask, the photosensitive printing element is treated to remove unpolymerized areas in the photopolymerizable layer and thereby form the relief surface. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. In some embodiments of the photosensitive elements having an in-situ mask, the treating step also removes the mask image (which had been exposed to actinic radiation) and the underlying unexposed areas of the photopolymerizable layer.

Treating of the photosensitive element includes (1) "wet" development wherein the photopolymerizable layer is contacted with a suitable developer solution to washout unpolymerized areas and/or (2) "dry" development wherein the photosensitive element is heated to a development temperature which causes the unpolymerized areas of the photopolymerizable layer to melt or soften or flow and then are removed. Dry development may also be called thermal development. It is also contemplated that combinations of wet and dry treatment can be used to form the relief.

Wet development is can be carried out at room temperature but usually is carried out at about 80 to 100° F. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Suitable semi-aqueous developers usually contain water and a water miscible organic solvent and an alkaline material. Suitable aqueous developers usually contain water and an alkaline material.

Development time can vary based on the thickness and type of the photopolymerizable material, the solvent being used, and the equipment and its operating temperature, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the uncured portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary based on equipment design, air flow, plate material, however, typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the photosensitive element includes one or more additional layers on the photopolymerizable layer, it is desirable (but necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. A preferred method for removing the uncured portions is by contacting an outermost surface of the element to an absorbent surface, such as a development medium, to absorb or wick away or blot the melt portions.

The term "melt" is used to describe the behavior of the unirradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

The development medium is selected to have a melt temperature exceeding the melt or softening or liquefying temperature of the unirradiated or uncured portions of the radiation curable composition and having good tear resistance at the same operating temperatures. The selected material withstands temperatures required to process the photosensitive element during heating. The development medium may also be referred to herein as development material, absorbent material, absorbent web, and web. The development medium should also possess absorbency for the molten elastomeric composition. The development medium is selected from nonwoven materials, paper stocks, fibrous woven material, open-celled foam materials, porous materials that contain more or less a substantial fraction of their included volume as void volume. The development medium can be in web or sheet form. In some embodiments, the development medium is a non-woven web of nylon or a non-woven web of polyester.

After the treatment step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the photosensitive element using an exposure device that has both sources of radiation.

The present invention prepares a relief printing form using a digital workflow that has been modified by imagewise exposing the photosensitive element through the in-situ mask to actinic radiation in an environment having an inert gas and an oxygen concentration of between 190,000 ppm and 100 ppm.

The modified digital workflow in the preparation of relief printing forms provides the advantages of conventional digital workflow to create the in-situ mask, and also provides the capability to create a plurality of fine, well-structured raised surface elements in which each raised element is substantially finely conically-shaped and flat-topped, thereby avoiding dot-sharpening effect that typically occurs with conventional digital image forming processes. The present method of modified digital workflow provides a shape to the raised surface elements that is similar to that formed with analog workflow, provides for formation of a plurality of fine raised surface elements, and provides for the capability to closely-space the individual raised surface elements in a given area. The shape of the raised surfaces of a printing form created by photopolymerization during imagewise exposure in the presence of an inert gas having limited oxygen concentration) and subsequent processing steps has been shown to differ based on the process used to fabricate the printing form. In particular, the shape of the raised surfaces produced by the present process differ from the shape of the raised surfaces produced by the conventional digital workflow process and to some extent from the traditional analog process. No longer is the relief structure formed by digital workflow limited by oxygen inhibition effect on the photopolymerizable layer. The present invention provides for the capability to create the relief image on the printing form that essentially is the recreation of the in-situ mask image, particularly in terms of size of openings in mask relative to the size of the raise element (i.e., halftone dot).

After treatment of the precursor, the resulting relief printing form has relief structure forming a pattern that includes at least one raised area having the plurality of individual surface elements raised from the floor for printing, and at least one recessed area which is a non-printing area. The mask having a plurality of openings having a line-screen resolution equal to or greater than 250 lines per inch and the imagewise exposure in an inert atmosphere having 190,000 ppm to 100 ppm oxygen creates the fine individually-formed raised surface elements (in the printing area), that can be closely-spaced to one another. Because the plurality of raised surface elements is individually formed, the printing area correspondingly also includes open portions (in which the photopolymerizable material was removed by treatment) that surround each individual raised surface element. Each of the raised surface elements of the plurality of individual raised surface elements has a top surface area that carries the imaging material, such as ink or coating material, which is printed onto the substrate. The plurality of raised surfaces of the raised areas of the printing form has a line screen resolution that is equal to or greater than 250 lines per inch, and corresponds to the line screen resolution used to form the openings in the mask. The feature size, i.e., the dot size, of the plurality of raised surfaces of the raised areas of the printing form is substantially the same or nearly the same as the corresponding openings in the in-situ mask associated with the printing form. That is, the feature size or dot size of each of the plurality of raised surface elements is only slightly smaller than the mask openings used to form the raise elements. In some embodiments, the dot size of the plurality of raised surface elements is smaller than the corresponding mask openings by less than 4%. In other embodiments, the dot size of the plurality of raised surface elements is smaller than the corresponding mask openings by less than 2%. In most embodiments, each raised surface element prepared by the present method has a top surface, i.e., substantially flat surface area that transfers the imaging material, with a diameter between about 10 and about 90 micrometers.

In one embodiment, coating material is applied to the top surface of the plurality of raised surface elements which print the coating material to form a uniform layer of the coating material on the substrate. The raised surface elements of the plurality of surface elements are sufficiently fine and closely-spaced such that the plurality of raised elements creates a uniform layer (i.e., a continuous stratum) of coating material when printing on the substrate (i.e., printed area). Because the printing form has a relief structure that includes at least one recessed area that does not print, the printing form prepared according to the present invention is capable of printing a pattern of at least one printed region and at least one non-printed region on the substrate, in which the printed region is the uniform layer of coating material (provided by the plurality of individual raised surface elements). The layer of the coating material formed on the printing region on the substrate is uniform or substantially uniform having a thickness in some embodiments from about 50 to 5000 angstroms, and in other embodiments from about 200 to about 1500 angstroms.

The imaging material that is printed on the substrate can be applied to the printing form, and in particular, to the plurality of raised surface elements by any means suitable. In most embodiments in relief printing, typically an anilox roller is used to meter the coating material onto the relief surface of the printing form. But the present method is not limited to the conventional method of application of the imaging material to the printing form.

The imaging material encompasses liquid materials suitable for printing. The imaging material may be referred to herein as a printing material or as a coating material. Imaging materials printed by the present method are not limited, and includes varnishes; inks; adhesives; materials suitable as liquid crystal alignment materials, such as, polyimides; and orientation materials.

Substrates suitable for printing by the present method are not limited and may have none, one, or more other layers or portions of layers present prior to the application of the imaging material. Examples of substrates include, but are not limited to, paper, paperboard, plastic, glass, polymeric films, etc.

Photosensitive Element

The photosensitive precursor element of the present invention used for preparing relief printing forms comprises at least one photopolymerizable layer. Relief printing forms encompass flexographic printing forms and letterpress printing forms. Relief printing is a method of printing in which the printing form prints from an image area, where the image area of the printing form is raised and the non-image area is depressed. Optionally, the photosensitive element includes a support. Optionally, the photosensitive element includes a layer of an actinic radiation opaque material adjacent the photopolymerizable layer. In one embodiment, the photosensitive element includes a layer of photopolymerizable composition composed at least of a binder, at least one ethylenically unsaturated compound, and a photoinitiator. In another embodiment, the layer of the photopolymerizable composition includes an elastomeric binder, at least one ethylenically unsaturated compound, and a photoinitiator. In some embodiments, the relief printing form is an elastomeric printing form (i.e., the photopolymerizable layer is an elastomeric layer) to accommodate the compression necessary for contact printing.

Unless otherwise indicated, the term "relief printing plate or element" encompasses plates or elements in any form suitable for flexographic printing and for letterpress printing. Unless otherwise indicated, the terms "photosensitive element" and "printing form" encompass elements or structures in any form suitable as precursors for printing, including, but not limited to, flat sheets, plates, seamless continuous forms, cylindrical forms, plates-on-sleeves, and plates-on-carriers.

The support can be any flexible material that is conventionally used with photosensitive elements used to prepare relief printing plates. In some embodiments the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. A preferred sleeve is a multiple layered sleeve as disclosed in U.S. Pat. No. 5,301,610. The sleeve may also be made of non-transparent, actinic radiation blocking materials, such as nickel or glass epoxy. The support has a thickness typically from 0.002 to 0.250 inch (0.0051 to 0.635 cm). In some embodiments, the thickness for the sheet form is 0.003 to 0.016 inch (0.0076 to 0.040 cm). In some embodiments, the sleeve has a wall thickness from 4 to 80 mils (0.010 to 0.203 cm) or more.

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 and U.S. Pat. No. 3,036,913 to give suitable adhesion between the support and the photopolymerizable layer. Alternatively, the surface of the support on which the photopolymerizable layer resides can be treated to promote adhesion between the support and the photopolymerizable layer, with flame-treatment or electron-treatment, e.g., corona-treated.

The photosensitive element includes at least one layer of a photopolymerizable composition. As used herein, the term "photopolymerizable" is intended to encompass systems that are photopolymerizable, photocrosslinkable, or both. The photopolymerizable layer is a solid layer formed of the composition comprising a binder, at least one ethylenically unsaturated compound, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for relief printing. As used herein, the term "solid" refers to the physical state of the layer which has a definite volume and shape and resists forces that tend to alter its volume or shape. A solid layer of the photopolymerizable composition may be polymerized (photohardened), or unpolymerized, or both. In some embodiments, the layer of the photopolymerizable composition is elastomeric.

The binder can be a single polymer or mixture of polymers. In some embodiments, the binder is an elastomeric binder. In other embodiments, the layer of the photopolymerizable composition is elastomeric. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. Preferably, the elastomeric block copolymer of an A-B-A type block copolymer, where A represents a non-elastomeric block, preferably a vinyl polymer and most preferably polystyrene, and B represents an elastomeric block, preferably polybutadiene or polyisoprene. In some embodiments, the elastomeric A-B-A block copolymer binders can be poly(styrene/isoprene/styrene) block copolymers, poly(styrene/butadiene/styrene) block copolymers, and combinations thereof. The binder is present in an amount of about 10% to 90% by weight of the photosensitive composition. In some embodiments, the binder is present at about 40% to 85% by weight of the photosensitive composition.

Other suitable binders include acrylics; polyvinyl alcohol; polyvinyl cinnamate; polyamides; epoxies; polyimides; styrenic block copolymers; nitrile rubbers; nitrile elastomers; non-crosslinked polybutadiene; non-crosslinked polyisoprene; polyisobutylene and other butyl elastomers; polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition.

The at least one compound capable of addition polymerization (i.e., monomer) is present in at least an amount of 5%, typically 10 to 20%, by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. In most embodiments, the photoinitiator for the main exposure (as well as post-exposure and backflash) is sensitive to visible or ultraviolet radiation, between 310 to 400 nm, and preferably 345 to 365 nm. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the type of printing plate desired, for example, from about 0.005 inches to about 0.250 inches or greater (about 0.013 cm to about 0.64 cm or greater). In some embodiments, the photopolymerizable layer has a thickness from about 0.005 inch to 0.0450 inch (0.013 cm to 0.114 cm). In some other embodiments, the photopolymerization layer has a thickness from about 0.020 inches to about 0.112 inches (about 0.05 cm to about 0.28 cm). In other embodiments, the photopolymerizable layer has a thickness from about 0.112 inches to about 0.250 inches or greater (0.28 cm to about 0.64 cm or greater).

It is well within the skill of the practitioner in the art to prepare a photosensitive precursor element that includes a layer of the photopolymerizable composition formed by admixing the binder, monomer, initiator, and other ingredients. In most embodiments, the photopolymerizable mixture is formed into a hot melt and, then optionally extruded, calendered to the desired thickness and planar or cylindrical shape. The photosensitive element includes at least one photopolymerizable layer that can be of a bi- or multi-layer construction. Further, the photosensitive element may include an elastomeric capping layer on the at least one photopolymerizable layer. Multilayer cover elements and compositions suitable as the elastomeric capping layer are disclosed in Gruetzmacher et al., U.S. Pat. No. 4,427,759 and U.S. Pat. No. 4,460,675.

The photosensitive element can include the actinic radiation opaque layer disposed above a surface of the photopolymerizable layer opposite the support, or can form an assemblage with separate carrier or element that includes the actinic radiation opaque layer. With the exception of traditional silver-halide based materials forming phototools, materials constituting the actinic radiation opaque layer and structures incorporating the actinic radiation opaque layer are not particularly limited, provided that the radiation opaque layer can be imagewise exposed to form the in-situ mask on or adjacent the photopolymerizable layer of the photosensitive element. The actinic radiation opaque layer may substantially cover the surface or only cover an imageable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer to minimize migration of materials between the photopolymerizable layer and the radiation opaque layer. Monomers and plasticizers can migrate over time if they are compatible with the materials in an adjacent layer, which can alter the laser radiation sensitivity of the radiation opaque layer or can cause smearing and tackifying of the radiation opaque layer after imaging. The actinic radiation opaque layer is also sensitive to laser radiation that can selectively remove or transfer the opaque layer.

In one embodiment, the actinic radiation opaque layer is sensitive to infrared laser radiation. In some embodiments, the actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer to form the in-situ mask. Suitable materials and structures for this actinic radiation opaque layer are disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer. Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers.

GLOSSARY

"Lines per inch" (LPI) is a measurement of printing resolution in systems which use a halftone screen. It is a measure of how close together lines in a halftone grid are. Higher LPI generally indicates greater detail and sharpness to an image.

"Halftone" is used for the reproduction of continuous-tone images, by a screening process that converts the image into dots of various sizes and equal spacing between centers. A halftone screen enables the creation of shaded (or grey) areas in images that are printed by transferring (or non-transferring) of a printing medium, such as ink.

"Dots per inch" (DPI) is a frequency of dot structures in a tonal image, and is a measure of spatial printing dot density, and in particular the number of individual dots that can be placed within the span of one linear inch (2.54 cm). The DPI value tends to correlate with image resolution. Typical DPI range for graphics applications: 75 to 150, but can be as high as 200.

"Line screen resolution", which may sometimes be referred to as "screen ruling" is the number of lines or dots per inch on a halftone screen.

"Pixel width" is the inverse of the DPI value.

"Mask opening" is the "clear" area of an integral mask to allow exposure to actinic radiation of the underlying photopolymerizable material. (In some embodiments, the clear area is created by removal of actinic radiation opaque material from the element. In other embodiments, the clear area is created non-transfer of actinic radiation opaque material to the element.) Mask opening is measured with a measuring microscope. The effective mask opening area is calculated by measuring the area of the opening and dividing by the total pixel area defined by the screen resolution in lines per inch (LPI). The total pixel area is calculated using the equation $(1/LPI)^2$ and the effective mask opening is defined as the (opening area)/$(1/LPI)^2$. The mask opening is typically expressed as a percentage (of total pixel area).

"Phototool opening" is the area of the phototool that is transparent to actinic radiation expressed as a percentage of the total pixel area and is calculated similar to the above mask opening area.

"Optical Density" or simply "Density" is the degree of darkness (light absorption or opacity) of an image, and can be determined from the following relationship:

Density=$\log_{10}$ {1/reflectance} where reflectance is {intensity of reflected light/intensity of incident light}

"Dot size on plate" is a measure of the diameter of the dot commonly assessed using a calibrated microscope or specialized optical apparatus. The measurement typically represents accurately the flat portion of the dot structure on the plate. "Dot area on plate" or "plate dot area" is commonly expressed as a percentage and is generally calculated by converting the dot size to an area (area=$\pi r^2$) and dividing by the total pixel area as defined by the screen resolution.

"Effective Printed Dot Area" is a calculated quantity based on the density measurements of region printed with a regular array of dots of uniform size called a tint area and density measurements of a printed region with complete ink coverage (also referred to as 100% coverage or solid coverage). The equation used is called the Murray Davies equation and is represented below:

Effective printed dot area=$(1-10^{-Dt})/(1-10^{-Ds})$ where Dt=tint density and Ds=solid density "Effective printing area (dot area) under pressure" is the dot area on the plate expressed as a percent of the total area that will come in contact with the substrate to be printed when the plate and substrate are in intimate contact with each other and when the plate/substrate exert pressure on each other.

"Plate to Print Dot Gain" represents the growth in the printed dot area from the dot area on plate expressed as a percentage of the total pixel area, to the effective printed dot area expressed as a percentage of coverage area. This is simply the difference between the two.

"Scan Lines Per Inch" is the writing resolution of an imaging device. Typical Scan Lines per Inch is about 2,540 (which represent a 10 micron spot size).

"Mask effective area" In the case of a plate created via the digital workflow, the mask effective area is the area of the ultraviolet radiation opaque layer (mask) that has been ablated to leave an opening through which ultraviolet light can be transmitted forming a polymerized structure beneath. This area is approximately round and is calculated by measuring the length and width of the opening using a measuring microscope, averaging those numbers to get an opening diameter and calculating the effective area using the equation for the area of a circle. The effective area is expressed by calculating the area this opening represents as a percentage of the total pixel area.

In the case of a plate created via the analog workflow, the mask effective area is the area of the film intermediate opening through which ultraviolet light can be transmitted forming a polymerized structure beneath. This area is approximately round and is calculated by measuring the length and width of the opening using a measuring microscope, averaging those numbers to get an opening diameter and calculating the effective area using the equation for the area of a circle. The effective area is then expressed by calculating the area this opening represents as a percentage of the total pixel area.

"Dot surface" During exposure, actinic radiation passes though the analog film intermediate or ultraviolet radiation opaque layer (mask) to create a photopolymerized region roughly conforming to the shape of the opening. Following processing unpolymerized material is removed leaving a raised printing element or in this case a dot. The dot surface represents the printing surface of the imaged element of an imaged and processed photopolymerizable printing plate.

"Dot effective area" This printing surface of the dot structure is approximately round and is calculated by measuring the length and width of the top of the dot structure using a measuring microscope, averaging those numbers to get a diameter and calculating the effective area using the equation for the area of a circle. The effective area is then expressed by calculating the area this opening represents as a percentage of the total pixel area.

"Valley depth" is the vertical distance between the top of two consecutive printing surfaces and the deepest point in the non-printing region between them.

EXAMPLES

In the following examples, all percentages are by weight unless otherwise noted. CYREL® photopolymerizable printing plates, CYREL® Digital Imager, CYREL® exposure unit, and CYREL® processor, are all available from The DuPont Company (Wilmington, Del.).

Instrumentation

Common imaging techniques, such as a microscope or optical devices, may be used to determine the observed dot area of the printing form. One example of a suitable optical device is a Betaflex flexo analyzer unit, from Beta Industries (Carlstadt, N.J.), which captures the raised structure of a relief printing form as an image for measurement and analysis of relief characteristics such as dot area, screen ruling, and dot quality.

A measuring microscope (Nikon Measurescope, model MM-11, from NIKON (USA) (Melville, N.Y.)) was used to measure dot size and other features as indicated in the raised areas of a plate.

Example 1

Two photosensitive precursor printing elements, CYREL® photopolymerizable printing plates, type DPI (0.067 inch (0.17 cm) thickness of photopolymer and support), having a ultraviolet radiation opaque layer disposed thereon, were identically imaged by ablating the radiation opaque layer with infrared laser radiation to create an in-situ mask on the element having a range of openings (1%, 5%, 10%, 20%, 50%, 70%, 90% area opening in mask) on a CYREL® Digital Imager. Opening size was measured on one plate with a Nikon measuring microscope to estimate the actual mask opening size. The line screen resolution was 150 lines per inch. Although outside of the recited range for high-resolution printing or coating by the present method, this example demonstrated the capability of the present method (of a modified digital workflow) to create feature sizes of raised surface elements in a relief structure of a relief printing form that are only slightly smaller than the corresponding openings in the associated mask, and thus are close to ideal.

As a Control, one plate was exposed to ultraviolet radiation through the in-situ mask in the presence of atmospheric oxygen per the normal convention (for digital workflow) on a CYREL® exposure unit and was processed in a solvent processor again per the normal convention.

The CYREL® exposure unit was modified to include an exposure chamber that provided an environment for exposing in the presence of an inert gas, which is nitrogen, and an oxygen concentration between 190,000 and 100 parts per million, as described in U.S. patent application Ser. No. 12/356,752, filed Jan. 21, 2009, which published as U.S. Pub. No. U.S. 2009/0191483. The second plate was placed in the chamber of the exposure unit which was be purged of oxygen by flowing nitrogen through the chamber to a point where the oxygen concentration of the purged gas was measured to be less than 1000 ppm at the start of the exposure. The second plate was exposed to the ultraviolet radiation while in the chamber with the given conditions (according to the inventive method of a modified digital workflow) and processed in a solvent processor per normal convention and at the same conditions that were used for the Control.

Figure 1:
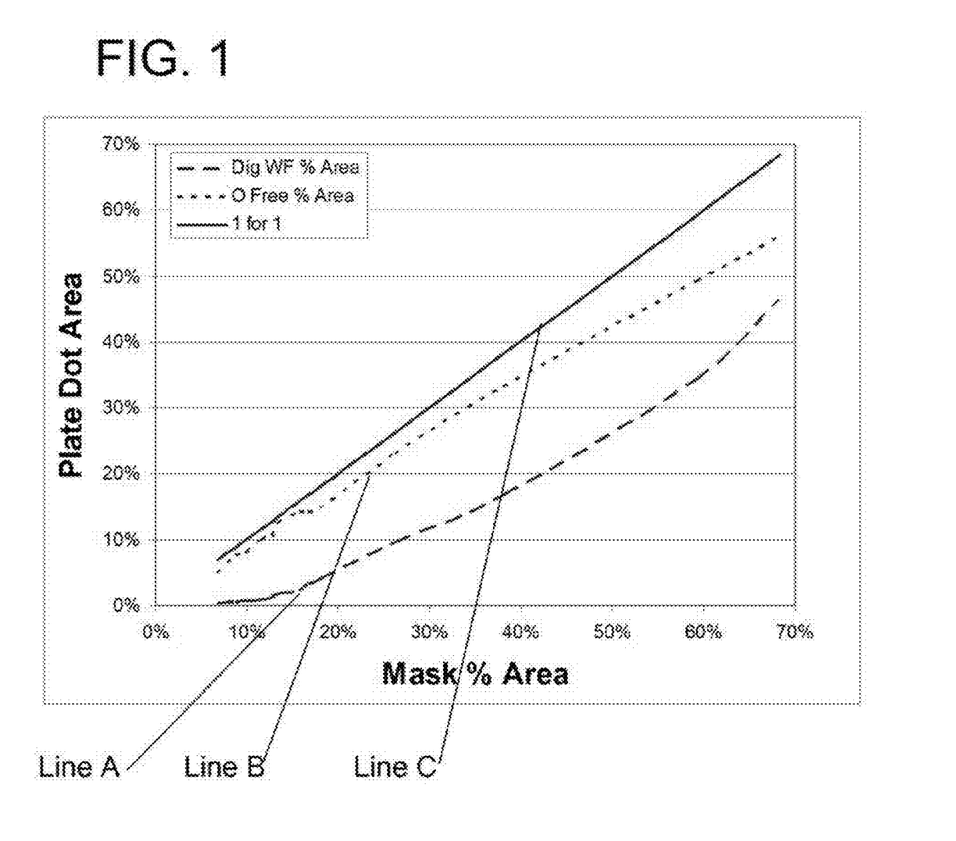
FIG. 1 is a graph of a measured dot area of a plate versus opening area of a mask used to prepare the plate, expressed as a percentage, showing the results of a Control plate and an inventive Plate prepared as described in Example 1.

After processing the raised relief features formed on the plates made by the two methods described above were measured on the Nikon measuring microscope with the results depicted in FIG. 1. FIG. 1 is a graph of a measured dot area of a plate versus opening area of a mask used to prepare the plate, expressed as a percentage. Line A, the long-dash line (Dig WF % Area) represents the Control of Example 1 prepared by conventional digital workflow. Line B, the short-dashed line (O-free % area) represents the plate of Example 1 prepared according to the inventive method of a modified digital workflow in which the plate was imagewise exposed through an in-situ mask to actinic radiation in the presence of a inert gas of nitrogen and at a concentration of oxygen of about 1000 ppm (controlled oxygen). Line C, the solid line (1 for 1) represents an ideal in which a dot area produced on a plate directly corresponds to the opening percentage area created in the associated in-situ mask for the plate.

Figure 2:
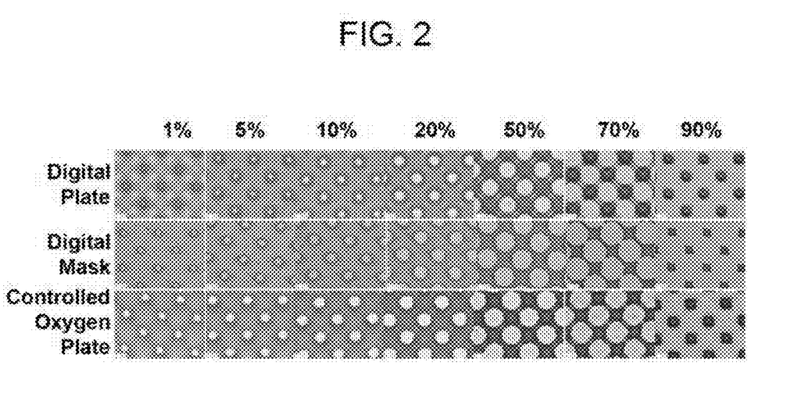
FIG. 2 is a reproduction of photographs of a range of dot areas of a Digital Mask (i.e., in-situ mask image), a Digital Plate (i.e., Control plate), and a Controlled Oxygen Plate prepared as described in Example 1.

Interpretation of the data showed that some level of reduction in feature size of the raised surface elements that were created in the inventive plate prepared by the modified digital workflow versus the ideal was observed when exposure is conducted in the presence of an inert gas and a controlled oxygen concentration environment. However, the Control shows that when imagewise exposure was conducted in the presence of atmospheric oxygen according to conventional digital workflow, significant reductions in the feature size of the raised surface elements are observed. See FIG. 2 which is a reproduction of photographs of a range of dot areas of an in-situ mask image, a Control plate, and a Plate prepared by the invention as described in Example 1. The range of dot areas labeled in FIG. 2 as "Digital plate" represents the Control of Example 1. The range of dot areas labeled in FIG. 2 as "Digital mask" is the in-situ mask formed on the Control and Plate of Example 1. The range of dot areas labeled in FIG. 2 as "Controlled Oxygen Plate" represents the plate of Example 1 prepared according to the inventive method of a modified digital workflow, in which the plate was imagewise exposed through an in-situ mask to actinic radiation in the presence of an inert gas of nitrogen and at a concentration of oxygen of 1000 ppm. The diameter of the dot surface (or printing surface of the dot) was compared to the corresponding opening in the digital mask, and the change in diameter is reported in the following table.

| Change in diameter | % Dot Area | | | | | |
| --- | --- | --- | --- | --- | --- | --- |
| | 1% | 5% | 10% | 20% | 50% | 70% |
| Digital Plate compared to digital mask (microns) | 40 | 48 | 43 | 39 | 35 | 28 |
| O-free Plate compared to digital mask (microns) | 8 | 6 | 8 | 6 | 13 | 15 |

Example 2

This example demonstrates a comparison of three different plate fabrication methods 1) conventional analog plate fabrication which used a film intermediate 2) conventional digital plate fabrication (digital workflow) which formed an in-situ mask and imagewise exposed through the mask in the presence of atmospheric oxygen as detailed above, and 3) a modified digital work flow plate fabrication method, which formed an in-situ mask and imagewise exposed through the mask in the presence of an inert gas, e.g., nitrogen, and with a concentration of oxygen between 190,000 and 100 ppm, as detailed above.

CYREL® photopolymerizable printing plates were used as the photosensitive precursor printing elements, which differed by the presence or absence of a radiation opaque digital layer disposed on the element, but having the same or substantially the same photopolymerizable composition forming the elastomeric layer. CYREL® photopolymerizable printing plates, type DPU (0.067 inch (0.17 cm) thickness of photopolymer and support) included the opaque digital layer, and type UXL (0.067 inch (0.17 cm) thickness of photopolymer and support) did not include an opaque digital layer.

The plate without the digital layer, identified as Plate 1, was imagewise exposed on the CYREL® exposure unit to ultraviolet radiation through a film intermediate (phototool) obtained from a manufacturer of polyimide coating printing plates. A vacuum was drawn to provide intimate contact between the film intermediate and the plate. The film intermediate had an image pattern (which forms coating layer on a substrate) created at a screen resolution of 350 dots per inch and an opening area of 30%. In this Example, the dots per inch (DPI) correspond to, i.e., is the same as, the line screen resolution which was 350 lines per inch (LPI). Plate 1 was exposed and solvent processed at conventional conditions.

A second plate having the radiation opaque digital layer, identified as Plate 2, was imaged by ablating the radiation opaque digital layer with infrared laser radiation to create an in-situ mask on the plate on a CYREL® Digital Imager. The in-situ mask created on the plate had a similar resolution and opening area as that of the film intermediate used for Plate 1, but not exactly identical as the 'write resolution' of the film imager device that created the film intermediate and plate imager device for the in-situ mask are different. Plate 2 was imagewise exposed to ultraviolet radiation through the in-situ mask in the presence of atmospheric oxygen, and then solvent processed at the same conditions as Plate 1.

A third plate having the radiation opaque layer, identified as Plate 3, was imaged to form an in-situ mask as described for Plate 2. Plate 3 was placed in an exposure chamber as described in Example 1, and imagewise exposed to ultraviolet radiation in an environment having nitrogen as the inert gas, and at a concentration of oxygen about 1000 ppm. Plate 3 was then processed in a solvent processor at the same conditions as Plate 1.

All three plates (Plates 1, 2, 3) that were fabricated as described above were measured and the data is provided on the following Table. (Note that the column labeled "Plate 3 Controlled Oxygen" represents the plate made by the modified digital workflow which exposes in an environment having an inert gas and a concentration of oxygen between 190, 000 and 100 ppm, and thus should not be interpreted as a plate made in an oxygen-free environment.)

|  | Units | Plate 1 Analog Film | Plate 1 Analog Process | Digital Mask | Plate 2 Digital Process | Plate 3 Controlled Oxygen |
|---|---|---|---|---|---|---|
| Screen Ruling | LPI | 350 | 350 | 356 | 356 | 356 |
| Pixel Width | micron | 72.6 | 72.6 | 71.4 | 71.4 | 71.4 |
| Mask Opening | micron | 44.6 | 44.6 | 43.8 | 43.8 | 43.8 |
| Mask Effective Area | % | 29.6% | 29.6% | 29.6% | 29.6% | 29.6% |
| Dot Surface | micron |  | 47.7 |  | 6.1 | 45 |
| Dot Effective Area | % |  | 33.9% |  | 0.6% | 31.2% |
| Mask to plate change | % |  | 4.3% |  | −29.0% | 1.6% |
| Valley depth | micron |  | 13 |  | 21 | 22 |

From the results, it was noted that a slight increase (3.1 microns) in the structure size of the raised surface elements was measured for Plate 1 which was fabricated by the standard analog process; a dramatic reduction (−37.7 microns) in the structure size of the raised surface elements was measured for Plate 2 which was fabricated by the conventional digital workflow process; and, a very small increase (1.2 microns) in the structure size of the raised surface elements was measured for Plate 3 which was fabricated by the modified digital workflow.

It is believed that at least Plate 3 would be effective at printing a uniform layer of a coating material on a substrate.

Example 1 and Example 2 demonstrated the magnitude of the oxygen-inhibition effect on a photopolymerizable printing element, and illustrated that the present method of imagewise exposure in the presence of an inert gas and with an oxygen concentration of between 190,000 to 100 ppm can effectively eliminate the polymerization inhibition properties enabling one to achieve the desired structure sizes for the raise surface elements.

Example 3

A CYREL® photopolymerizable printing element having a radiation opaque digital layer, type DPI (0.045 inch (0.114 cm) thickness of photopolymer layer and support) was used to evaluate the ability to create very small structures of the raised surface elements when prepared according to the inventive method of the modified digital workflow. The digital layer was imaged by ablation to form an in-situ mask on a CYREL® Digital Imager. The element was imaged to form the in-situ mask having multiple image patterns at resolutions of 10,000, 8,000 and 4,000 scan lines per inch and at spatial resolutions of 300, 400 and 600 DPI (dots per inch). The element was placed in an exposure chamber as described in Example 1, and imagewise exposed to actinic radiation in the presence of nitrogen as the inert gas and with a concentration of oxygen less than 1000 ppm and above 100 ppm. The exposed element was solvent processed using conventional solvent processing conditions, to form a printing plate having a relief structure of raised surface elements at each of the image patterns.

The dot structures, i.e., raised surface elements, of the plate at each of the image pattern locations were measured using the Nikon measuring microscope, and the data reported in the following Table. The image patterns were representative of the raised relief areas (e.g. 40% surface area for 300/400 DPI and 20% surface area for 600 DPI) that are suitable for end-use applications in which a coating material, such as polyimide, is printed on a substrate to form a uniform layer on the substrate, by a relief printing plate.

|  | Pixel Width | | | Structure Surface Size | | |
|---|---|---|---|---|---|---|
| Spatial Frequency (DPI) | 300 | 400 | 600 | 300 | 400 | 600 |
| Calculated size | 87.4 | 63.5 | 42.3 | 60.4 | 45.3 | 23.9 |
| Measured size at scan resolution = 10,000 | 82 | 63 | 43 | 59 | 45 | 22 |
| Measured size at scan resolution = 8000 | 85 | 64 | 43 | 56 | 45 | 21 |
| Measured size at scan resolution = 4000 | 86 | 75 | 72 | 61 | 48 | 44 |

The results illustrated that it is difficult to accurately produce high spatial resolution structures (i.e., raise surface elements) with low scan resolution (e.g. 400/600 DPI with 4,000 scan lines per inch) in the relief printing form. Also, with suitable imaging resolution small structures (~21 microns) can be achieved at very high spatial resolutions (600 dots per inch) for the relief printing form. Additionally, structures of the raised surface elements in a relief printing form that are sufficient for printing a layer of a coating material can be achieved using the inventive method.

What is claimed is:

1. A method for printing a material onto a substrate comprising:
    a) providing a relief printing form from a photosensitive element comprising a layer of a photopolymerizable composition containing a binder, an ethylenically unsaturated compound, and a photoinitiator, with steps comprising:
        i) forming an in-situ mask having a plurality of openings through an area opaque to actinic radiation adjacent the photopolymerizable layer, the openings having a line screen resolution equal to or greater than 250 lines per inch;
        ii) exposing the photopolymerizable layer to actinic radiation through the mask openings in an environment having an inert gas and a concentration of oxygen between 190,000 parts per million (ppm) and 100 ppm; and
        iii) treating the element resulting from step ii) to form a relief structure having a plurality of raised surfaces with a line-screen resolution equal to or greater than 250 lines per inch;
    b) applying the material to the plurality of raised surfaces; and
    c) contacting the material from the plurality of raised surfaces to the substrate thereby transferring the material to the substrate.

2. The method of claim 1 wherein the contacting step forms a layer of the material on the substrate.

3. The method of claim 2 wherein a pattern of two or more regions of the layer of the material is formed on the substrate.

4. The method of claim 1 wherein the material on the substrate has a thickness of 50 to 5000 angstroms.

5. The method of claim 2 wherein the layer of material on the substrate has a thickness of about 200 to 1500 angstroms.

6. The method of claim 2 wherein the openings in the mask have a dot area that is between 20 to 80% of a total pixel area.

7. The method of claim 1 wherein the contacting step creates a graphic image of the material on the substrate, the graphic image selected from the group consisting of halftone illustrations, text, line features, and combinations thereof.

8. The method of claim 1 wherein the material is a liquid crystal alignment material.

9. The method of claim 1 wherein the material is a polyimide.

10. The method of claim 1 wherein the material is selected from the group consisting of varnishes, inks, and adhesives.

11. A method for preparing a relief printing form having an elastomeric layer with a relief structure comprising a plurality of raised surfaces with a line-screen resolution equal to or greater than 250 lines per inch, comprising:
   a) providing a photosensitive element comprising an elastomeric layer of a photopolymerizable material comprising a binder, an ethylenically unsaturated compound, and a photoinitiator;
   b) forming an in-situ mask having a plurality of openings through an area opaque to actinic radiation adjacent to the photopolymerizable layer, the openings having a line-screen resolution equal to or greater than 250 lines per inch;
   c) exposing the photopolymerizable layer to actinic radiation through the mask openings in an environment having an inert gas and a concentration of oxygen between 190,000 parts per million (ppm) and 100 ppm; and
   d) treating the element resulting from step c) to form the relief structure having a plurality of raised surfaces with a line-screen resolution of equal to or greater than 250 lines per inch.

12. The method of claim 1 or 11 wherein the line-screen resolution of the plurality of raised surfaces of the relief structure is the same or substantially the same as the line-screen resolution of the mask.

13. The method of claim 1 or 11 wherein the resolution of the mask openings is selected from the group consisting of 250 lines per inch (LPI), 300 LPI, 350 LPI, 400 LPI, and 600 LPI.

14. The method of claim 1 or 11 wherein the resolution of the raised surfaces equals or is greater than 400 lines per inch.

15. The method of claim 1 or 11 wherein each raised surface has a top surface having a diameter between about 10 and about 90 micrometers.

16. The method of claim 1 or 11 wherein the concentration of oxygen in the environment is less than or equal to 80,000 ppm.

17. The method of claim 1 or 11 wherein the inert gas is selected from the group consisting of argon, helium, neon, krypton, xenon, nitrogen, carbon dioxide, and combinations thereof.

18. The method of claim 1 or 11 wherein a layer of an actinic radiation opaque material is disposed on or adjacent the photopolymerizable layer, and step i) comprises imagewise exposing the actinic radiation opaque layer with laser radiation forming the in-situ mask.

19. The method of claim 18 wherein the imagewise exposing with laser radiation is selected from the group consisting of (a) selectively ablating the actinic radiation opaque layer from the photopolymerizable layer, and (b) selectively transferring portions of the actinic radiation opaque layer to the photopolymerizable layer.

20. The method of claim 1 or 11 wherein the treating step iii) is selected from the group consisting of:
   a) processing the element of step ii) with at least one washout solution selected from the group consisting of solvent solution, aqueous solution, semi-aqueous solution, and water; and
   b) heating the element of step ii) to a temperature sufficient to cause areas to melt, flow, or soften, and removing the areas.

* * * * *